United States Patent
Jeon et al.

(10) Patent No.: US 12,363,832 B2
(45) Date of Patent: Jul. 15, 2025

(54) APPARATUS FOR PROVIDING DISPLAY DEVICE AND METHOD OF PROVIDING DISPLAY DEVICE USING THE SAME

(71) Applicant: Samsung Display Co., LTD., Yongin-si (KR)

(72) Inventors: Eun Jeong Jeon, Suwon-si (KR); Jung Su Kim, Asan-si (KR); Myong Hoon Roh, Cheonan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 663 days.

(21) Appl. No.: 17/564,609

(22) Filed: Dec. 29, 2021

(65) Prior Publication Data
US 2022/0352081 A1 Nov. 3, 2022

(30) Foreign Application Priority Data
Apr. 30, 2021 (KR) .................. 10-2021-0056747

(51) Int. Cl.
*H01L 23/538* (2006.01)
*H05K 1/18* (2006.01)
(Continued)

(52) U.S. Cl.
CPC ....... *H05K 3/0052* (2013.01); *H01L 23/5387* (2013.01); *H05K 1/18* (2013.01);
(Continued)

(58) Field of Classification Search
None
See application file for complete search history.

(56) References Cited

U.S. PATENT DOCUMENTS 11,233,112 B2 * 1/2022 Choi ............... H10K 50/84
11,316,138 B2 * 4/2022 Sung ............... H10K 59/873
(Continued)

FOREIGN PATENT DOCUMENTS

JP  2010120125 A  6/2010
JP  2018177299 A  11/2018
(Continued)

OTHER PUBLICATIONS

Office Action dated Nov. 5, 2024 of the corresponding Korean Patent Application No. 10-2021-0056747.

*Primary Examiner* — Long Pham
(74) *Attorney, Agent, or Firm* — CANTOR COLBURN LLP

(57) ABSTRACT

A device for providing a display device, the device including a support supporting a driver of a driving film and a flexible film having edges, a jig facing the support with the flexible film and the driver therebetween, the jig including first and second edges facing and parallel to each other, a third edge orthogonal to the first and second edges, first support pins arranged along the first edge, second support pins arranged along the second edge, third support pins arranged along the third edge, and a cutting region surrounded by the first, second and third support pins, and a cutting portion which corresponds to the cutting region and separates a portion of the flexible film which corresponds to the driver from a remainder of the flexible film, to define the driving film of the display device.

13 Claims, 25 Drawing Sheets

(51) Int. Cl.
*H05K 3/00* (2006.01)
*H10H 20/01* (2025.01)
*H10H 20/857* (2025.01)
*H10H 29/14* (2025.01)

(52) U.S. Cl.
CPC .......... *H10H 20/01* (2025.01); *H10H 20/857* (2025.01); *H10H 29/142* (2025.01); *H10H 20/0364* (2025.01)

(56) References Cited

U.S. PATENT DOCUMENTS

| | | | |
|---|---|---|---|
| 11,540,392 B2* | 12/2022 | Jang | H05K 1/189 |
| 2020/0287169 A1* | 9/2020 | Sung | H10K 71/00 |
| 2021/0259108 A1* | 8/2021 | Jang | G02F 1/13458 |
| 2023/0239992 A1* | 7/2023 | Lee | G06F 1/1681 |
| | | | 361/600 |
| 2024/0090282 A1* | 3/2024 | Choi | H10K 71/166 |

FOREIGN PATENT DOCUMENTS

| | | |
|---|---|---|
| KR | 20020076540 A | 10/2002 |
| KR | 100404997 B1 | 11/2003 |
| KR | 101109419 B | 1/2012 |
| KR | 102036335 B1 | 10/2019 |

\* cited by examiner

APPARATUS FOR PROVIDING DISPLAY DEVICE AND METHOD OF PROVIDING DISPLAY DEVICE USING THE SAME This application claims priority to Korean Patent Application No. 10-2021-0056747 filed on Apr. 30, 2021, all the benefits accruing therefrom under 35 U.S.C. § 119, the entire contents of which are incorporated herein by reference.

BACKGROUND

(a) Field

The present disclosure relates to a device for manufacturing (or providing) a display device and a method of manufacturing (or providing) the display device using the same.

(b) Description of the Related Art

A flat panel display includes a liquid crystal display (LCD), a plasma display panel (PDP), an organic light emitting diode (OLED) device, a field effect display (FED), and an electrophoretic display device.

A screen-to-body ratio, that is, a ratio by which the screen occupies the display device when the display device is seen from the front, is increasing by reducing a bezel of the display device. The screen-to-body ratio reflects technical levels of the display device and simultaneously is one important factor for consumers to select products.

As the bezel of the display device is reduced, an area of a non-display area disposed near a display area is reduced, and hence, a gap between a display panel and a driving film such as a chip on film (COF) for electrically connecting a driver for transmitting a signal for driving the display device and the display panel is reduced.

The above information disclosed in this Background section is only for enhancement of understanding of the background of the invention, and therefore it may contain information that does not form the prior art that is already known in this country to a person of ordinary skill in the art.

SUMMARY

When a gap between a driving film such as a chip on film (COF) and a display panel is reduced, defects may be generated such as peeling-off of an end portion of the COF or short-circuiting by conductive particles of the COF.

The invention has been made in an effort to provide a device for manufacturing a display device which reduces or effectively prevents generation of defects at an end portion of a COF and provides a narrow gap between the COF and a display panel, and a method of manufacturing or providing the display device using the same.

However, the objective of the invention is not limited to the aforementioned one, and may be extended in various ways within the spirit and scope of the invention.

An embodiment of the invention provides a device for providing a display device including a support for supporting a flexible film, a jig facing the support, a plurality of first support pins in sequence along a first edge of the jig, a plurality of second support pins in sequence along a second edge facing the first edge of the jig and in parallel to the first edge, a plurality of third support pins in sequence along a third edge that is orthogonal to the first edge and the second edge of the jig, and a cutting portion in a region surrounded by the first support pins, the second support pins, and the third support pins.

A first planar shape of the first support pins and the second support pins may correspond to a second planar shape of the third support pins.

The first planar shape and the second planar shape may be a quadrangle.

A first planar shape of the first support pins and the second support pins may be different from a second planar shape of the third support pins.

The first planar shape may be a quadrangle, and the second planar shape may be a circle or an oval.

The second planar shape of the third support pins may be different depending on positions along the flexible film.

The first planar shape may be a quadrangle, a planar shape of the two third support pins on an edge from among the third support pins may be a triangle, and a planar shape of the remaining third support pins excluding the two third support pins from among the third support pins may be a quadrangle.

The first support pins and the second support pins may simultaneously descend toward the support, and the third support pins may descend toward the support at a different time from that of the first support pins and the second support pins.

The first support pins and the second support pins may simultaneously descend toward the support, and the third support pins may then descend toward the support.

The first support pins, the second support pins and the third support pins may descend, and the cutting portion may then descend toward the support.

The third support pins together with the first support pins and the second support pins may descend toward the support.

The first support pins, the second support pins, and the third support pins may simultaneously descend, and the cutting portion may then descend toward the support.

An embodiment of the invention provides a method for providing a driving film for a display device, including supporting a flexible film on a support, descending a jig facing the support toward the support, descending a plurality of first support pins in sequence along a first edge of the jig toward the support, descending a plurality of second support pins in sequence along a second edge facing the first edge of the jig and in parallel to the first edge toward the support, descending a plurality of third support pins in sequence along a third edge that is orthogonal to the first edge and the second edge of the jig toward the support, and descending a cutting portion in a region surrounded by the first support pins, the second support pins, and the third support pins toward the support.

The descending of the first support pins and the descending of the second support pins toward the support may be simultaneously performed, and the descending of the third support pins may be performed after the descending of the first support pins and the descending of the second support pins.

The descending of the first support pins, the descending of the second support pins toward the support, and the descending of the third support pins may be simultaneously performed.

The descending of a cutting portion may be performed after the descending of the first support pins, the descending of the second support pins toward the support and the descending of the third support pins.

The cutting portion may be descended while the first support pins may be inserted into a first hole of the flexible film and may be fixed in the descending of the first support pins, the second support pins may be inserted into a second hole of the flexible film and may be fixed in the descending of the second support pins toward the support, and the third support pins are inserted into a third hole of the flexible film and are fixed in the descending of the third support pins.

According to one or more embodiment of the device for providing a display device and the method using the same, defects may not be generated to the end portion of the COF, and a narrow gap between the COF and the display panel may be provided.

BRIEF DESCRIPTION OF THE DRAWINGS

The above and other advantages and features of this disclosure will become more apparent by describing in further detail embodiments thereof with reference to the accompanying drawings, in which.

DETAILED DESCRIPTION

Figure 1:
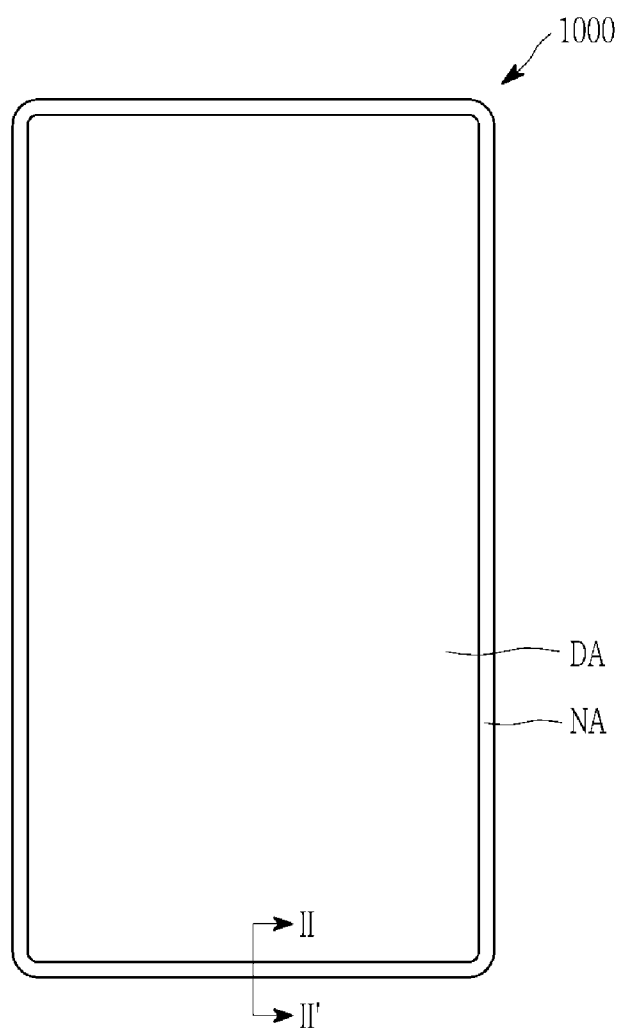
FIG. 1 shows a top plan view of an embodiment of a display device.

The invention will be described more fully hereinafter with reference to the accompanying drawings, in which embodiments of the invention are shown. As those skilled in the art would realize, the described embodiments may be modified in various different ways, all without departing from the spirit or scope of the present disclosure.

Parts that are irrelevant to the description will be omitted to clearly describe the invention, and the same elements will be designated by the same reference numerals throughout the specification. As used herein, a reference number may indicate a singular element or a plurality of the element. For example, a reference number labeling a singular form of an element within the drawing figures may be used to reference a plurality of the singular element within the text of specification.

The accompanying drawings are provided only in order to allow embodiments disclosed in the specification to be easily understood and are not to be interpreted as limiting the spirit disclosed in the specification, and it is to be understood that the invention includes all modifications, equivalents, and substitutions without departing from the scope and spirit of the invention.

Parts that are irrelevant to the description are omitted to clearly describe the present disclosure, and like reference numerals designate like elements throughout the specification.

In the drawings, the thickness of layers, films, panels, regions, etc., are exaggerated for clarity. For ease of description, the thicknesses of some layers and areas are exaggerated.

It will be understood that when an element such as a layer, film, region, or substrate is referred to as being related to another element such as being "on" another element, it can be directly on the other element or intervening elements may also be present. In contrast, when an element is referred to as being related to another element such as being "directly on" another element, there are no intervening elements present. The word "on" or "above" means disposed on or below the object portion, and does not necessarily mean disposed on the upper side of the object portion based on a gravitational direction.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. Unless explicitly described to the contrary, the word "comprise" and variations such as "comprises" or "comprising" will be understood to imply the inclusion of stated elements but not the exclusion of any other elements.

The phrase "in a plan view" means viewing a target portion from the top, and the phrase "in a cross-sectional view" means viewing a cross-section formed by vertically cutting a target portion from the side. Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Throughout the specification, when it is described that a part is "connected" to another part, the part may be "directly connected" to the other element, may be "connected" to the other part through a third part, or may be connected to the other part physically or electrically, and they may be referred to by different titles depending on positions or functions, but respective portions that are substantially integrated into one body may be connected to each other.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Various embodiments and variations will be described with reference to accompanying drawings.

Figure 3:
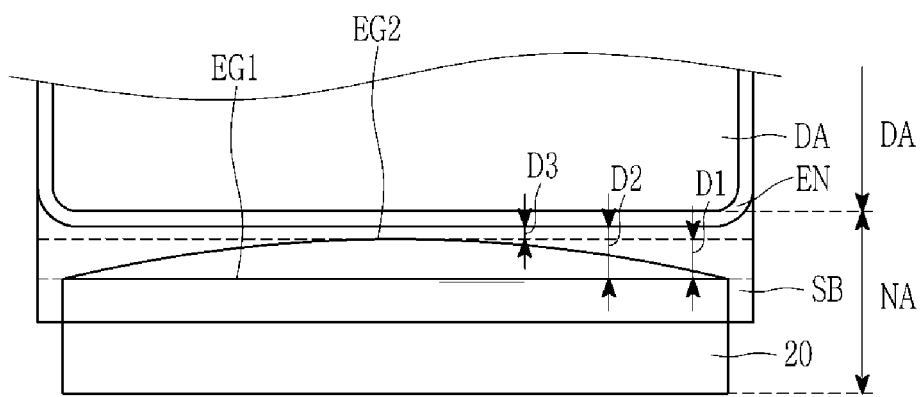
FIG. 3 shows an enlarged plan view of a portion of FIG. 1.
Figure 4:
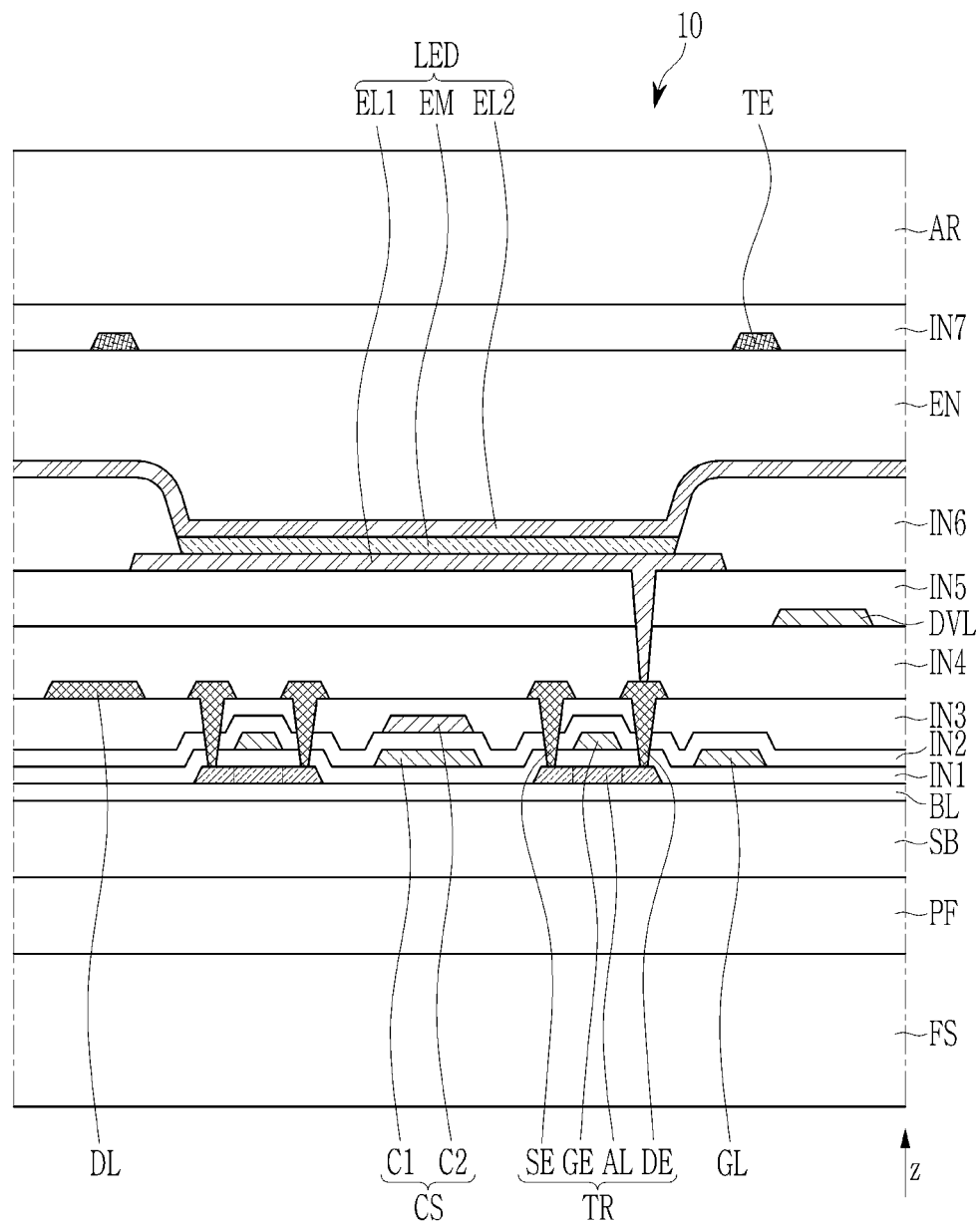
FIG. 4 shows a cross-sectional view of an embodiment of a stacked structure of a display panel.

An embodiment of a display device 1000 will now be described with reference to FIG. 1 to FIG. 4. FIG. 1 shows a plan view of an embodiment of a display device 1000, FIG. 2 shows a cross-sectional view with respect to line II-II' of FIG. 1, FIG. 3 shows an enlarged plan view of FIG. 1, and FIG. 4 shows an enlarged cross-sectional view of an embodiment of a stacked structure of a display panel 10 of a display device 1000.

Figure 2:
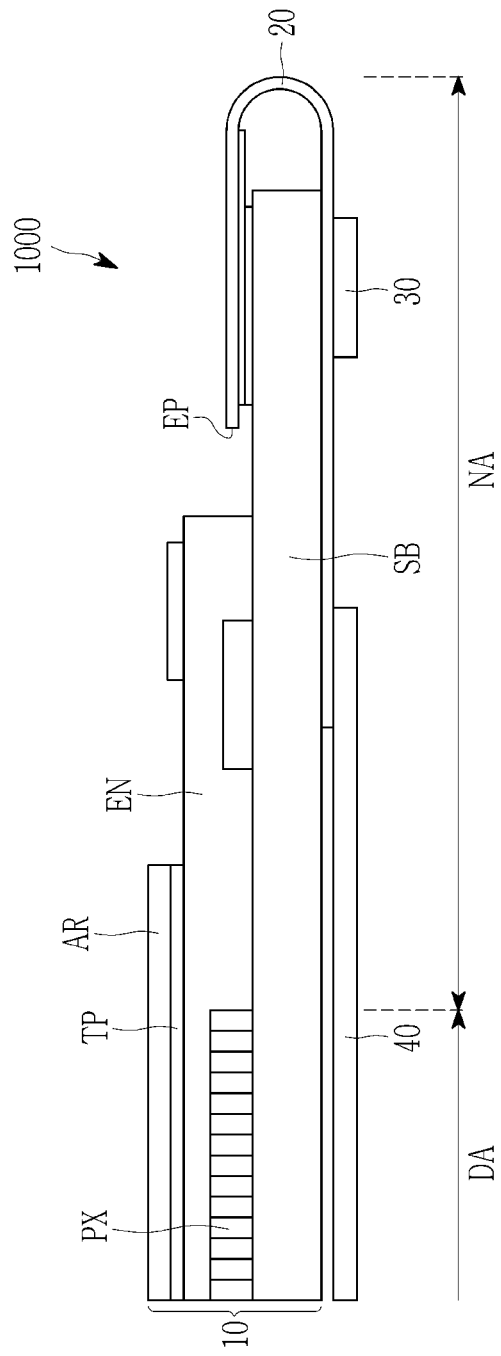
FIG. 2 shows a cross-sectional view with respect to line II-II' of FIG. 1.

Referring to FIG. 1 and FIG. 2, the display device 1000 may include a display panel 10, and a driving unit which is connected to the display device 1000. The driving unit may include a flexible printed circuit film 20 connected to the display panel 10, an integrated (IC) chip 30 attached or connected to the flexible printed circuit film 20, and a main driver 40. The flexible printed circuit film 20 may include a portion of a flexible film 100, without being limited thereto. The driving unit together with a portion of the flexible film 100 may define a driving film of the display device 1000, without being limited thereto.

The display panel 10 may include a display area DA for displaying images, and a non-display area NA which is adjacent to the display area DA such as to surround the display area DA and displaying no images. The display area DA may correspond to a screen or display screen of the display device 1000. The display panel 10 displays images and/or senses an external input (e.g., a touch) relative to the display panel 10. Various components or layers of the display device 1000 may include a display area DA and a non-display area NA corresponding to those described above.

A plurality of pixels PX are disposed in the display area DA. Here, the pixels PX are minimum units for displaying images, and respective pixels PX may display a color, for example, one of red, green, and blue with various values of luminance according to input image signals (e.g., electrical signals provided to the pixels PX).

A driving unit for generating and/or processing various electrical signals (e.g., voltages, driving signal, control signal, etc.) for driving the display panel 10 may be disposed in the non-display area NA. The driving unit may include a data driver for applying data voltages to data lines, a gate driver for applying gate signals to gate lines, and a signal controller for controlling the data driver and the gate driver.

The driver may be disposed on each of opposing sides or one side of the display area DA. The data driver and the signal controller may be provided as an IC chip 30 (also referred to as a driving IC chip), and the IC chip 30 may be mounted on the flexible printed circuit film 20 and may be electrically connected to the display panel 10. The IC chip 30 may be mounted in the non-display area NA of the display panel 10.

The display panel 10 may include a substrate SB, and a plurality of pixels PX may be disposed on the substrate SB.

The display panel 10 may include an encapsulation layer EN for covering the pixels PX. The encapsulation layer EN may seal the display area DA including the pixels PX to reduce or effectively prevent moisture or oxygen from permeating into the pixels PX.

A touch portion TP may be disposed on the encapsulation layer EN.

An antireflection layer AR for reducing reflection of external light may be disposed on the touch portion TP. The antireflection layer AR may include a polarization layer and/or a phase delay layer. The antireflection layer AR may include a light blocking member and a color filter.

The flexible printed circuit film 20 connected to the display panel 10 may be bendable. Referring to FIG. 2, the flexible printed circuit film 20 which is bent may dispose the IC chip 30 and the main driver 40 attached to the flexible printed circuit film 20 on a rear side of the substrate SB.

Referring to FIG. 3, the encapsulation layer EN for sealing the pixels PX disposed on the substrate SB may be disposed to be separated from the flexible printed circuit film 20.

When a first end portion EP of the flexible printed circuit film 20 which is closest to the encapsulation layer EN from among end portions of the flexible printed circuit film 20 has an edge EG1 substantially forming a straight line, the encapsulation layer EN and the flexible printed circuit film 20 may be disposed to have a first gap D1 along the edge EG1. Differing from this, when a center portion of the first end portion EP of the flexible printed circuit film 20 has a protruding edge EG2 compared to the edge EG1, the encapsulation layer EN and the flexible printed circuit film 20 may be disposed spaced apart by a plurality of distances such as to have a second gap D2 or a third gap D3 that are both smaller than the first gap D1 depending on positions along the protruding edge EG2.

As a bezel of the display device 1000 is reduced, the area (e.g., planar area) of the peripheral area NA of the display device 1000 is reduced, and the gap between the encapsulation layer EN of the display panel 10 and the flexible printed circuit film 20 which is connected to the display panel 10 is reduced.

When the gap between the encapsulation layer EN of the display panel 10 and the flexible printed circuit film 20 which is connected to the display panel 10 is reduced, an end portion of the flexible printed circuit film 20 which is closest to the encapsulation layer EN of the display panel 10 may peel off of the display panel 10, or conductive particles of the flexible printed circuit film 20 may be stacked or concentrated between the encapsulation layer EN and the flexible printed circuit film 20 so a short-circuit may be generated.

Therefore, in or more embodiment, a gap between the end portion of the encapsulation layer EN and the first end portion EP of the flexible printed circuit film 20 which is closest to the end portion of the encapsulation layer EN may be maximized such as providing the edge EG1 of the flexible printed circuit film 20 as substantially a straight line.

An example of a stacked structure of the display area DA of the display panel 10 of the display device 1000 will now be described with reference to FIG. 4.

The display panel 10 includes a substrate SB, a transistor TR formed (or provided) on the substrate SB, and light emitting element such as a light emitting diode LED connected to the transistor TR. The light emitting diode LED may correspond to the pixel PX and/or a light emitting area thereof.

The substrate SB may be a flexible substrate made of a polymer such as a polyimide, a polyamide, or a polyethylene terephthalate. The substrate SB may include a barrier layer for preventing permeation of moisture or oxygen. In an embodiment, for example, the substrate SB may include at least one polymer layer and at least one barrier layer, and the polymer layer and the barrier layer may be alternately stacked.

A buffer layer BL may be disposed on the substrate SB. The buffer layer BL may include an inorganic insulating material such as a silicon oxide or a silicon nitride.

A semiconductor layer AL of the transistor TR may be position on the buffer layer BL, and a first insulating layer IN1 may be disposed on the semiconductor layer AL. The semiconductor layer AL may include a source region and a drain region, and a channel region therebetween. The semiconductor layer AL may include a semiconductor material such as polysilicon, an oxide semiconductor, or amorphous silicon.

A first conductor including a gate electrode GE of the transistor TR, a gate line GL, and a first capacitor electrode C1 of the capacitor CS may be disposed on the first insulating layer IN1. The gate electrode GE, the gate line GL and the first capacitor electrode C1 may be respective patterns of a same first conductive material layer, without being limited thereto. As being respective patterns of a same material layer, elements may be considered in a same layer as each other.

A second insulating layer IN2 may be disposed on the first conductor. A second conductor including a second capacitor electrode C2 of the capacitor CS may be disposed on the second insulating layer IN2. The first conductor and/or the second conductor may include a metal such as molybdenum (Mo), copper (Cu), aluminum (Al), silver (Ag), chromium (Cr), tantalum (Ta), or titanium (Ti).

A third insulating layer IN3 may be disposed on the second insulating layer IN2 and the second conductor. The insulating layers IN1, IN2, and IN3 may include an inorganic insulating material.

A third conductor including a source electrode SE and a drain electrode DE of the transistor TR, and a data line DL may be disposed on the third insulating layer IN3. The source electrode SE and the drain electrode DE may be respectively connected to the source region and the drain region of the semiconductor layer AL through openings of the insulating layers IN1, IN2, and IN3.

A fourth insulating layer IN4 may be disposed on the third conductor. A fourth conductor including a driving voltage line DVL may be disposed on the fourth insulating layer IN4. The third conductor and the fourth conductor may include a metal such as aluminum (Al), copper (Cu), silver (Ag), molybdenum (Mo), chromium (Cr), gold (Au), platinum (Pt), palladium (Pd), tantalum (Ta), tungsten (W), titanium (Ti), or nickel (Ni), or a metal alloy thereof.

A fifth insulating layer IN5 may be disposed on the fourth conductor. The insulating layers IN4 and IN5 may include an organic insulating material.

A first electrode EL1 of the light emitting diode LED may be disposed on the fifth insulating layer IN5. The first electrode EL1 may be referred to as a pixel electrode. The first electrode EL1 may be connected to the drain electrode DE through openings of the insulating layers IN4 and IN5 and may receive a data signal for controlling luminance of the light emitting diode LED. The transistor TR to which the first electrode EL1 is connected may be a driving transistor or a transistor which is electrically connected to the driving transistor.

A sixth insulating layer IN6 may be disposed on the fifth insulating layer IN5. The sixth insulating layer IN6 may be referred to as a pixel defining layer, and may have an opening overlapping the first electrode EL1. An emission member EM including an emission layer may be disposed on the first electrode EL1 in the opening of the sixth insulating layer IN6, and the second electrode EL2 may be disposed on the emission member EM. The second electrode EL2 may be referred to as a common electrode.

The first electrode EL1, the emission member EM, and the second electrode EL2 may together configure a light emitting diode LED that may be an organic light emitting diode. The first electrode EL1 and the second electrode EL2 may be an anode and a cathode of the light emitting diode LED, respectively.

An encapsulation layer EN may be disposed on the second electrode EL2. The encapsulation layer EN may encapsulate the light emitting diode LED to reduce or effectively prevent moisture or oxygen from permeating from outside the encapsulation layer EN. The encapsulation layer EN may be a thin film encapsulation layer including at least one inorganic material layer and at least one organic material layer.

A touch sensor layer including a touch electrode TE may be disposed on the encapsulation layer EN. The touch electrode TE may have a mesh shape having an opening overlapping the light emitting diode LED. A buffer layer (not shown) may be disposed between the encapsulation layer EN and the touch sensor layer. A seventh insulating layer IN7 for covering the touch electrode TE may be disposed on the touch sensor layer.

An antireflection layer AR for reducing reflection of external light may be disposed on the seventh insulating layer IN7. The antireflection layer AR may include a polarization layer. The antireflection layer AR may be attached within the display panel 10 by an adhesive or may be provided in direct contact with the seventh insulating layer IN7. Instead of the antireflection layer AR, the encapsulation layer EN, the touch sensor layer, and/or the seventh insulating layer IN7 may be formed to be a refractive index matching structure and may thus obtain an antireflection effect. The layers disposed between the substrate SB and the antireflection layer AR may define a pixel layer.

A protection film PF for protecting the display panel 10 may be disposed below the substrate SB. The display panel 10 and/or the substrate SB may be bendable at a bending region. The display panel 10 may include a pad portion at which a pad is disposed for connection to an external device (not shown). The protection film PF may be made of (or include) a polymer such as polyethylene terephthalate, polyethylene naphthalate, or a polyimide. To reduce a bending stress of a bending region, the protection film PF may not be disposed in the bending region. A bending protection layer (a stress easing layer) may be disposed in the bending region) so that wires disposed in the bending region may not be disconnected or damaged.

A functional sheet FS including at least one of a cushion layer, a heat radiation sheet, a light blocking sheet, a watertight tape, and an electromagnetic blocking film may be disposed below the protection film PF. The functional sheet FS may not be disposed in the bending region or on the pad portion.

Positions and disposal of the above-described elements are modifiable in many ways according to designs of the display device 1000.

Figure 5:
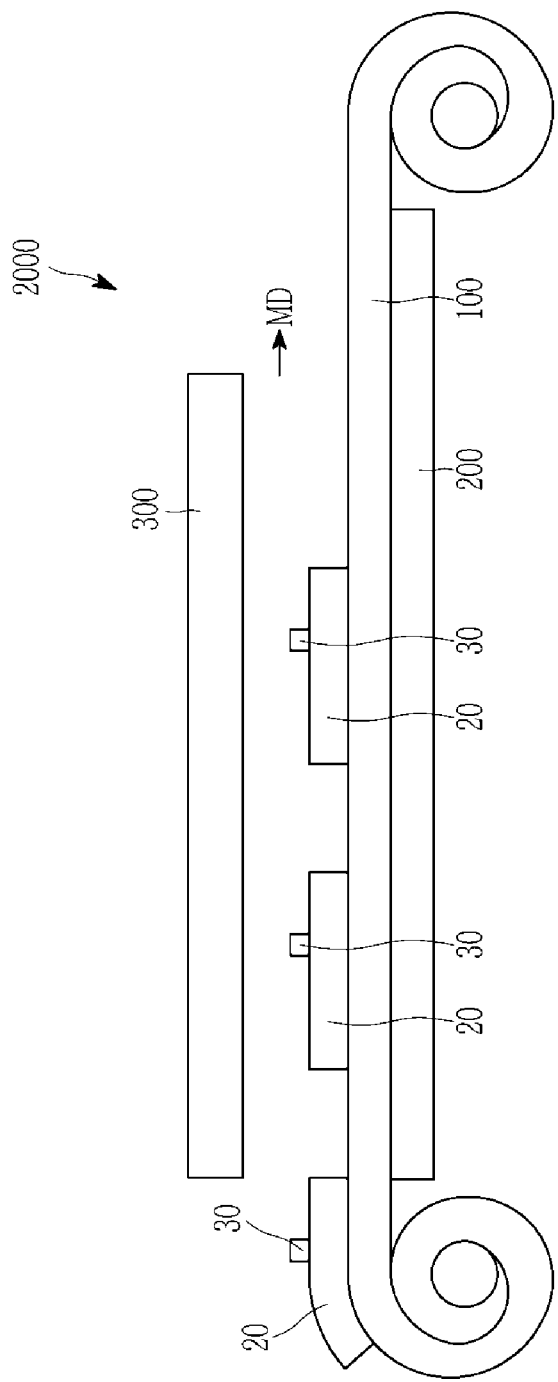
FIG. 5 shows a perspective view of an embodiment of a device for providing a display device.

An embodiment of a device 2000 for providing a display device 1000 will now be described with reference to FIG. 5 and FIG. 6. FIG. 5 shows a perspective view of an embodiment of a device 2000 for providing a display device 1000, and FIG. 6 shows an enlarged view of a portion of the device 2000 in FIG. 5.

Referring to FIG. 5, the device 2000 for providing a display device 1000 includes a support 200 for supporting a flexible film 100 on which a plurality of flexible printed circuit films 20 and a plurality of IC chips 30 are formed, and a jig 300 facing the support 200. The jig 300 faces the support 200 with the flexible film 100, the plurality of flexible printed circuit films 20 and the plurality of IC chips 30 therebetween.

Figure 6:
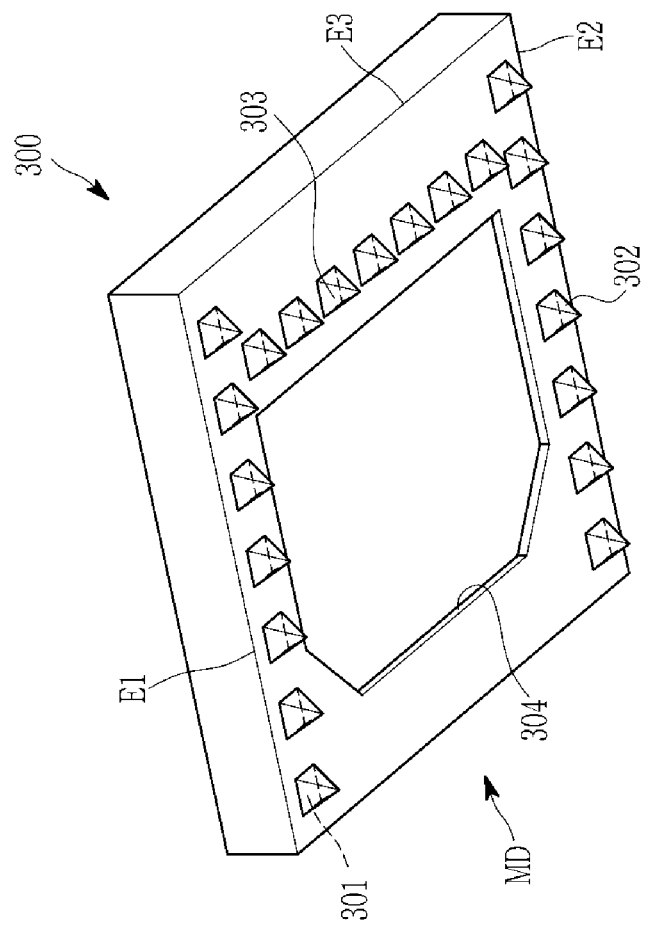
FIG. 6 shows an enlarged perspective view of a portion of FIG. 5.

Referring to FIG. 6, the jig 300 has a plurality of outer edges. The device 2000 for providing a display device 1000 includes a plurality of first support pins 301 disposed in sequence along a first edge E1 of the jig 300, a plurality of second support pins 302 disposed in sequence along a second edge E2 facing (e.g., opposite to) the first edge E1 and disposed in parallel to the first edge E1, a plurality of third support pins 303 disposed in sequence along a third edge E3 that is orthogonal to the first edge E1 and the second edge E2 of the jig 300, and a cutting portion 304. Although not shown in FIG. 6, the jig 300 may further include a hole cutting portion 305 (see FIG. 13). The jig 300 may also include a cutting region which is surrounded by the plurality of first support pins 301 together with the plurality of second support pins 302 and the plurality of third support pins 303, where the cutting portion 304 corresponds to the cutting region and separates a portion of the flexible film 100 which corresponds to the driver from a remainder of the flexible film 100, to define a driving film of the display device 1000.

The cutting portion 304 may be surrounded by the first support pins 301, the second support pins 302, and the third support pins 303.

Each support pin among a plurality of first support pins 301, a plurality of second support pins 302, and a plurality of third support pins 303 may have a square horn shape having a cross-section form in a quadrangular shape (e.g., four-sided pyramid). The first support pins 301, the second support pins 302, and the third support pins 303 may have substantially the same cross-sectional areas.

The flexible film 100 includes or defines a plurality of first holes h1 and a plurality of second holes h2 arranged along respective edges with respect to a plurality of IC chips 30. The flexible film 100 may further include a plurality of third holes h3 disposed between flexible printed circuit films 20 which are adjacent to each other along the flexible film 100.

The flexible film 100 moves in a movement direction MD along the support 200 of the device 2000 for providing a display device 1000, and is sequentially cut, thereby forming a driving film including a cut portion of the flexible film 100 together with the flexible printed circuit film 20 to which the IC chip 30 is attached. The flexible film 100 and/or the support 200 may have a length along a first direction corresponding to the movement direction MD, a width taken along a second direction which crosses the first direction. A thickness direction of various components or layers of the device 2000, the display device 1000, etc., may be taken along a third direction crossing each of the first direction and the second direction. In FIG. 5, for example, a first direction may be the horizontal direction and the third direction may be the vertical direction.

The first edge E1 and the second edge E2 of the jig 300 may be parallel to the movement direction MD of the flexible film 100 (e.g. a first direction), and the third edge E3 of the jig 300 may be parallel to the direction that is orthogonal to the movement direction MD of the flexible film 100 (e.g., second direction).

The first holes h1 and the second holes h2 of the flexible film 100 may be arranged parallel to the movement direction MD of the flexible film 100, and the third holes h3 of the flexible film 100 may be arranged parallel to the direction that is orthogonal to the movement direction MD of the flexible film 100.

A method using a device 2000 for providing a display device 1000 will now be described with reference to FIG. 7 to FIG. 14 together with FIG. 5 and FIG. 6. FIG. 7 to FIG. 14 show an embodiment of a method for manufacturing (or providing) a display device 1000.

Figure 7:
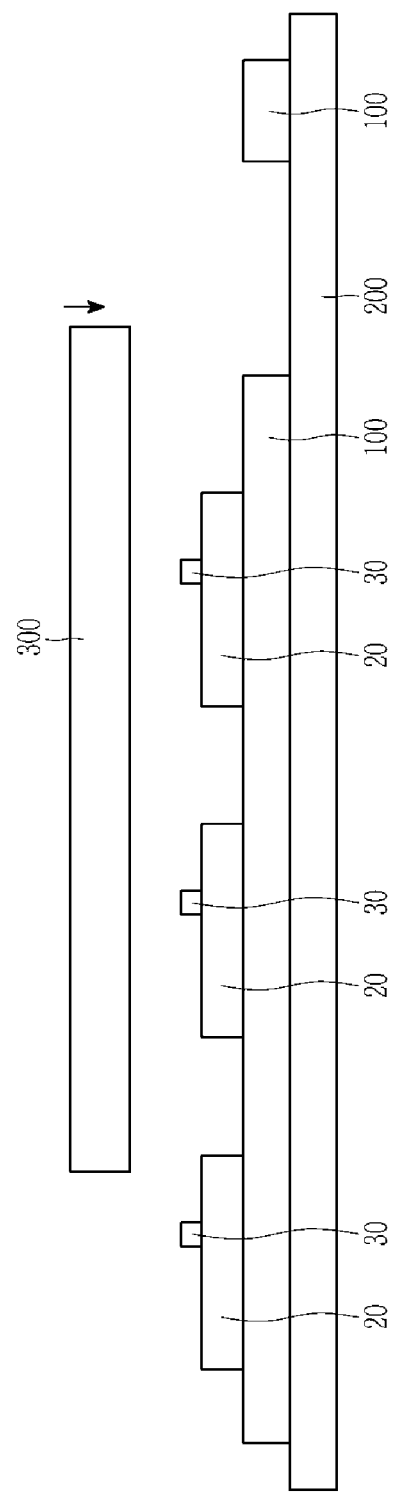
FIG. 7 and FIG. 8 show an embodiment of a method for providing a display device.
Figure 8:
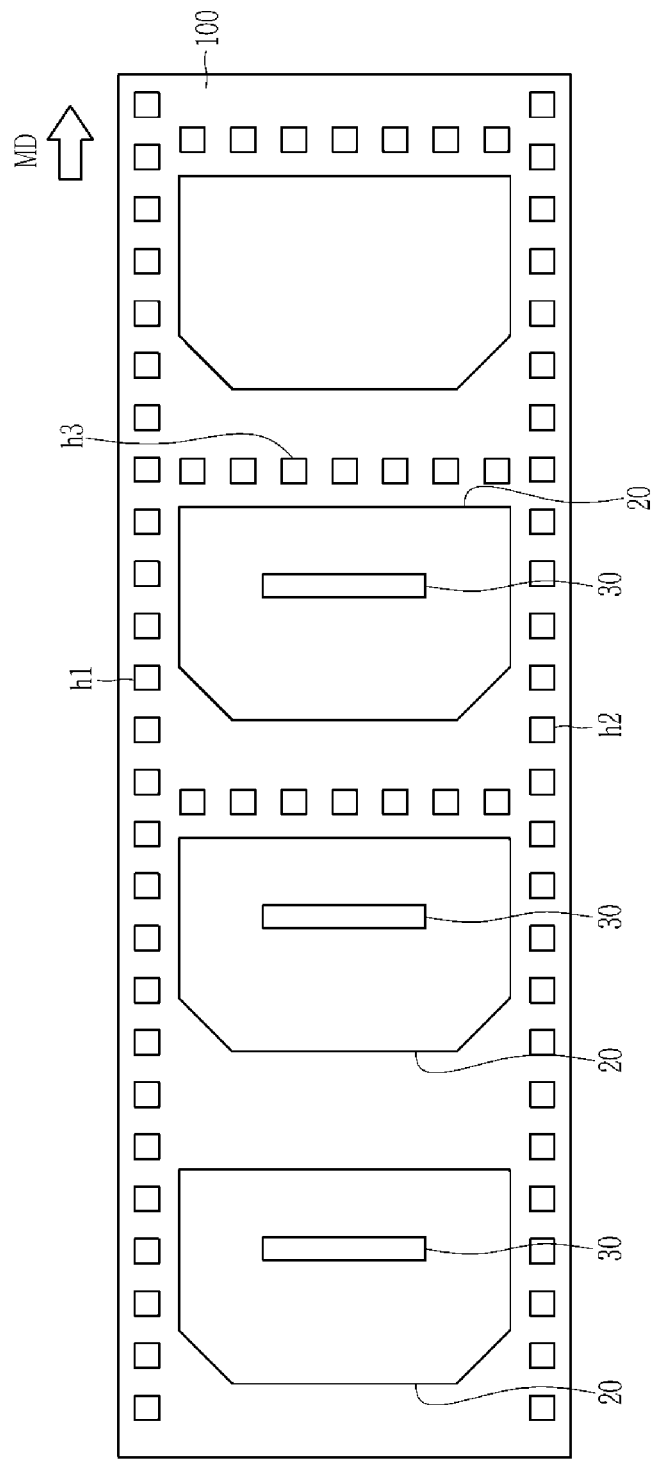

Referring to FIG. 7 and FIG. 8 together with FIG. 5 and FIG. 6, the jig 300 of the device 2000 for providing a display device 1000 descends toward the flexible film 100 (downward arrow in FIG. 7) while the flexible film 100 is supported on the support 200 of the device 2000 for providing a display device 1000.

Figure 9:
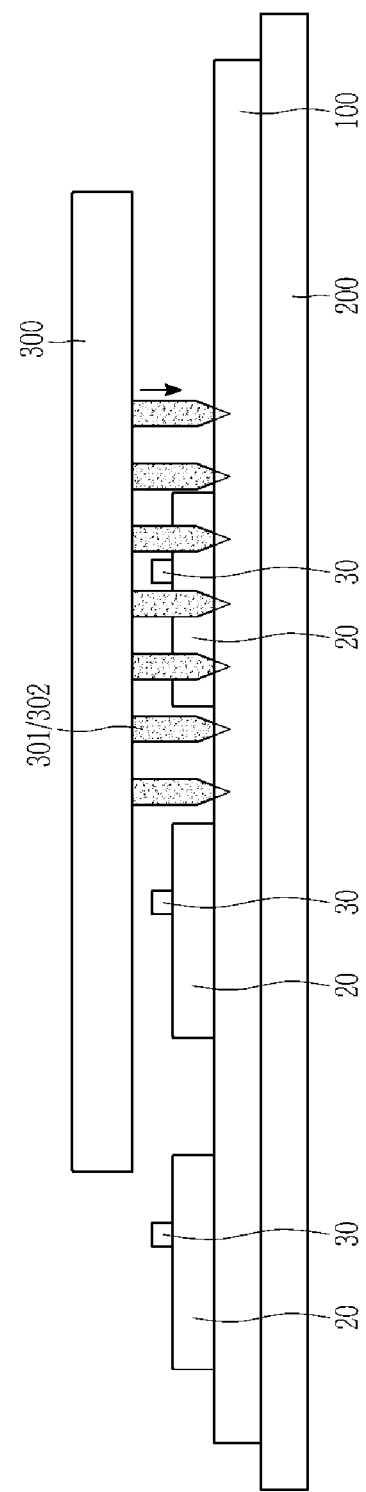
FIG. 9 and FIG. 10 show an embodiment of a method for providing a display device.
Figure 10:
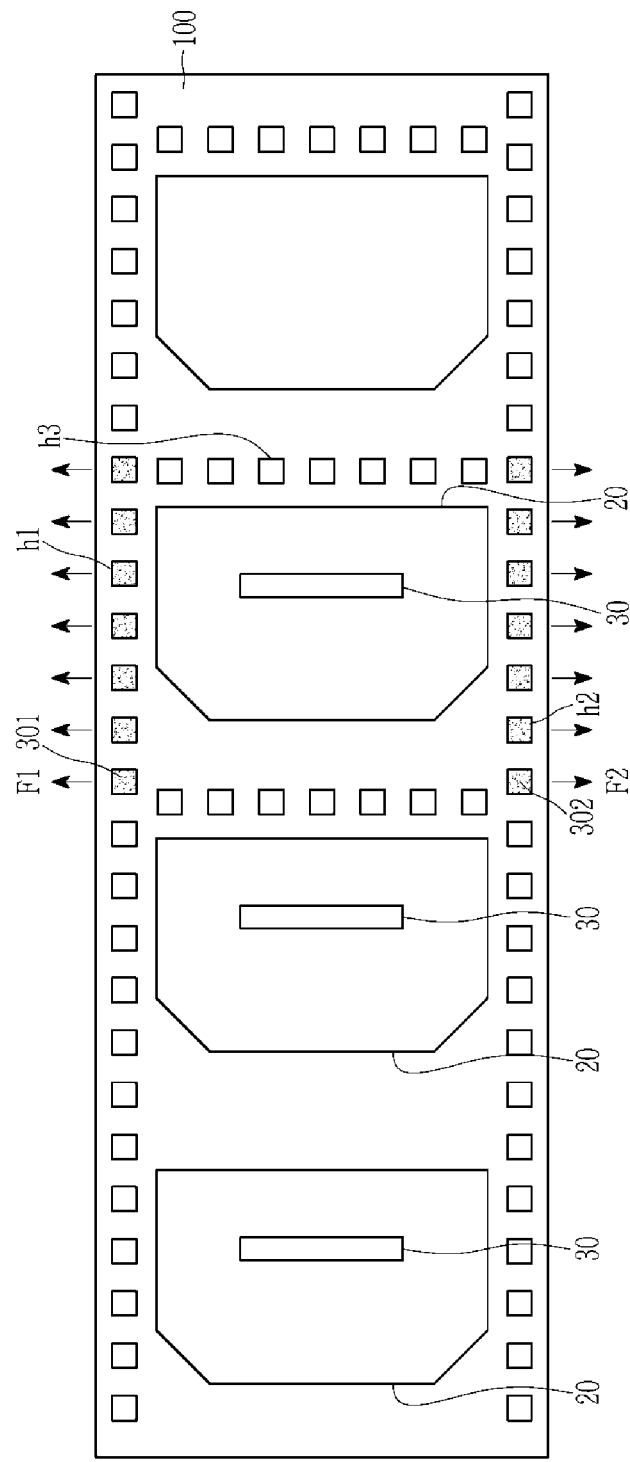

Referring to FIG. 9 and FIG. 10, while the jig 300 of the device 2000 for providing a display device 1000 is disposed on the flexible film 100, the first support pins 301 disposed in sequence along the first edge E1 of the jig 300 and the second support pins 302 disposed in sequence along the second edge E2 facing the first edge E1 and in parallel to the first edge E1 descend toward the flexible film 100 (downward arrow in FIG. 7) while the flexible film 100 is supported on the support 200. The first support pins 301 are respectively inserted into the first holes h1 of the flexible film 100, and the second support pins 302 are respectively inserted into the second holes h2 of the flexible film 100, and then fixed in a position relative to the flexible film 100. The first support pins 301 and the second support pins 302 may descend together with each other and/or with the jig 300. In an embodiment, the first support pins 301 and the second support pins 302 simultaneously descend toward the support 200, and the third support pins 303 descend toward the support 200 at a different time from a time that the first support pins 301 and the second support pins 302 descend.

By this, a first force F1 and a second force F2 are applied in an outward direction from respective edges of the flexible film 100 which oppose each other along the width direction (e.g., opposing arrows in FIG. 10), and the respective edges of the flexible film 100 are not bent but are maintained to be coplanar with each other.

Figure 11:
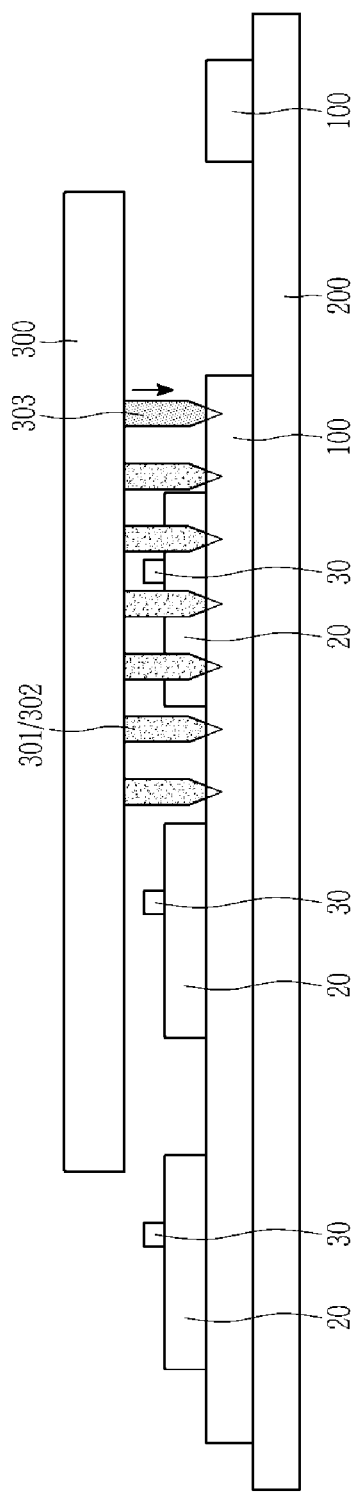
FIG. 11 and FIG. 12 show an embodiment of a method for providing a display device.
Figure 12:
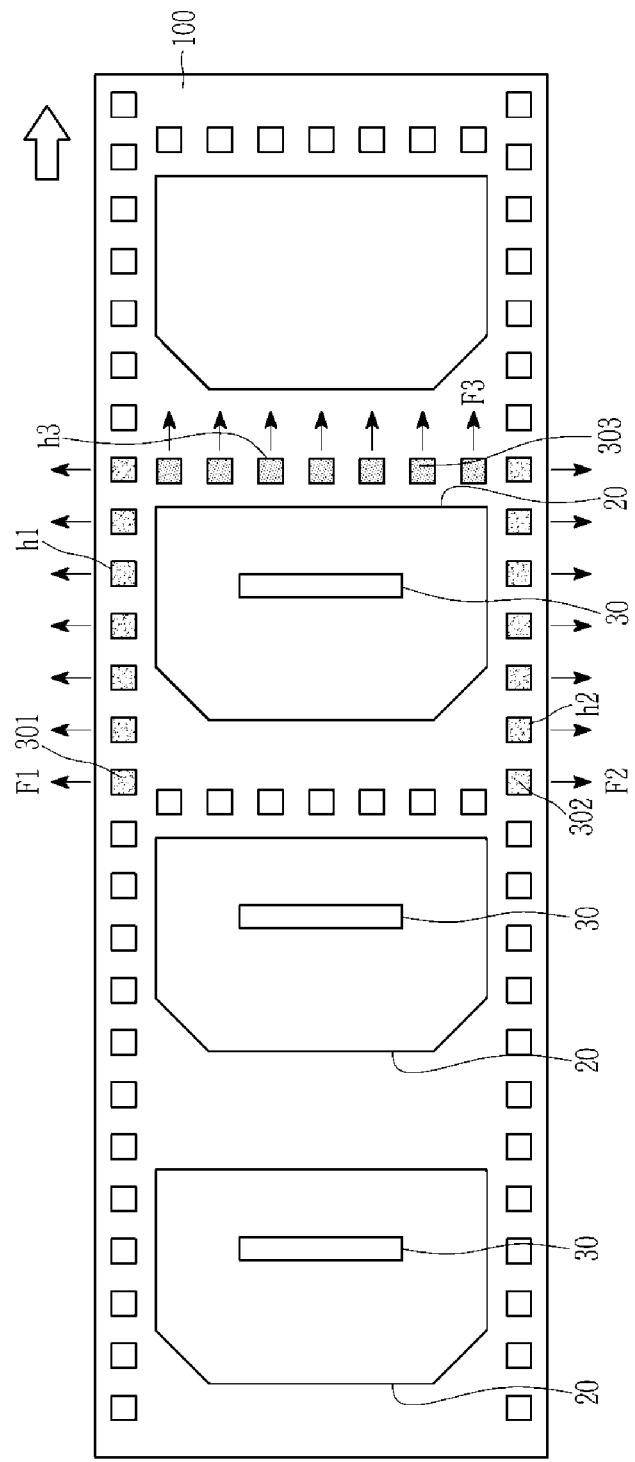

Referring to FIG. 11 and FIG. 12, while the first support pins 301 are inserted into the first holes h1 of the flexible film 100 and the second support pins 302 are inserted into the second holes h2 of the flexible film 100, the third support pins 303 disposed in sequence along the third edge E3 of the jig 300 descend toward the flexible film 100 having the first support pins 301 and the second support pins 302 extended thereinto, and the third support pins 303 are inserted into the third holes h3 of the flexible film 100 and are then fixed in a position relative to the flexible film 100. In an embodiment, the first support pins 301 and the second support pins 302 simultaneously descend toward the support 200, and the third support pins 303 descend toward the support 200 at a time which is different from a time of descent of the first support pins 301 and the second support pins 302. In an embodiment, the third support pins 303 descend toward the support 200 after descent of the first support pins 301 and the second support pins 302 toward the support 200.

Therefore, the first force F1 and the second force F2 are applied to the flexible film 100 outwardly from the respective edges of the flexible film 100, a third force F3 is applied in a direction that is orthogonal to the respective edges of the flexible film 100, and by this, the respective edges of the flexible film 100 are not bent but are maintained to be unfolded, and simultaneously, the flexible film 100 may be maintained to be flat while a center portion thereof to each of the respective edges is not bent.

Figure 13:
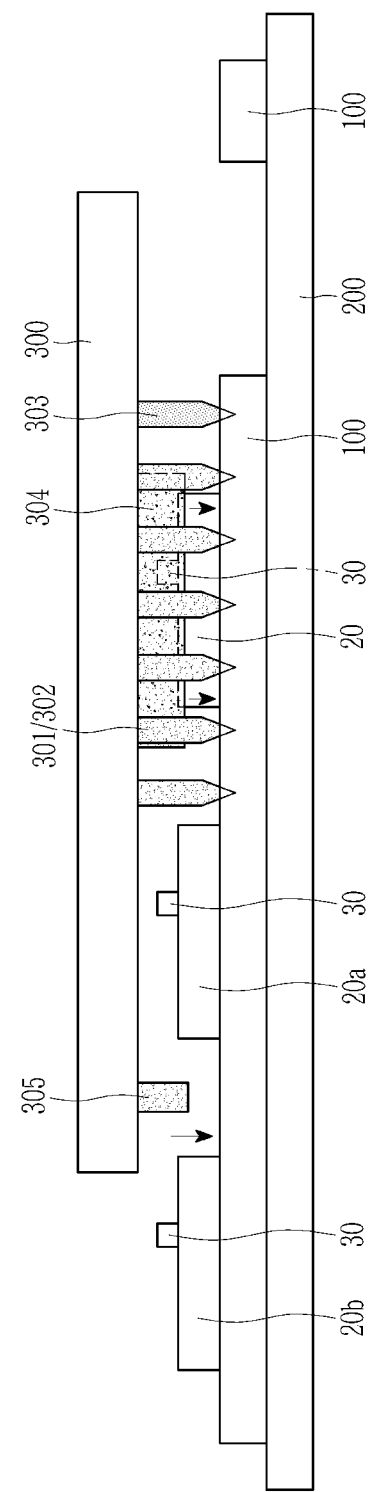
FIG. 13 and FIG. 14 show an embodiment of a method for providing a display device.
Figure 14:
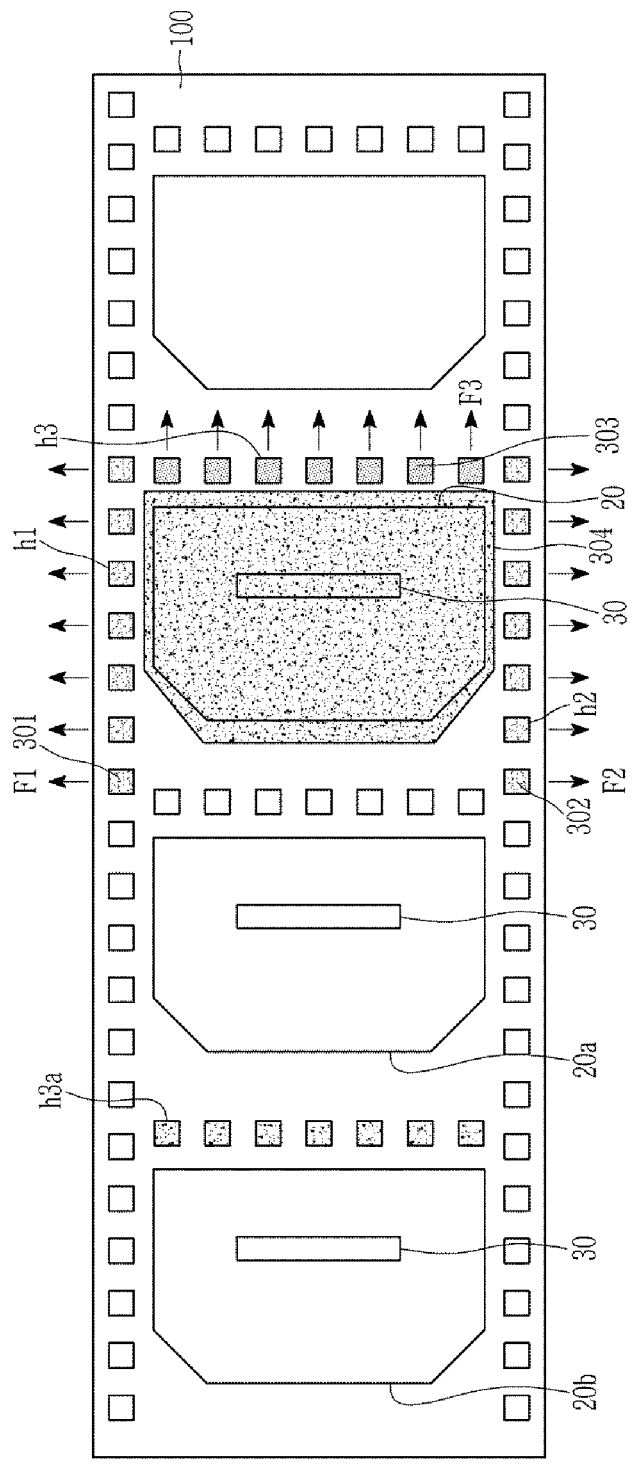

Referring to FIG. 13 and FIG. 14, while the first support pins 301, the second support pins 302, and the third support pins 303 of the jig 300 are respectively inserted into the first holes h1, the second holes h2, and the third holes h3 of the flexible film 100 and fixed thereto, the cutting portion 304 of the jig 300 descends, and a portion of the flexible film 100 which corresponds to the flexible printed circuit film 20 and the IC chip 30 attached thereto, is cut from a remaining portion of the flexible film 100 to provide a driving film including a cut portion of the flexible film 100 together with the flexible printed circuit film 20 to which the IC chip 30 is attached (e.g., a completed flexible printed circuit film). In an embodiment, the cutting portion 304 descends toward the support 200 after descent of the first support pins 301, the second support pins 302 and the third support pins 303 toward the support 200.

Referring to FIG. 13, each of the first support pins 301, the second support pins 302, the third support pins 303, the cutting portion 304 and the hole cutting portion 305 may protrude a distance toward the support 200 and define a distal end closest to the support 200. Distal ends of the various pins may be closer to the support 200 than distal ends of the cutting portion 304 and/or the hole cutting portion 305. In an embodiment, the flexible film 100 may be cut by the cutting portion 304 and the hole cutting portion 305 at substantially a same time, owing to the cutting portion 304 and the hole cutting portion 305 protruding a substantially similarly distance.

In this instance, the hole cutting portion 305 of the jig 300 descends together with the cutting portion 304 and is disposed near the flexible film 100 which is cut by the cutting portion 304, so a preliminary third hole h3a may be formed in the flexible film 100. The preliminary third hole h3a may be provided in plural including a plurality of preliminary third holes h3a arranged along the flexible film 100 in a direction crossing the movement direction MD. Along the movement direction MD of the flexible film 100, the plurality of preliminary third holes h3a are at a position between two preliminary portions of the flexible film 100 corresponding to flexible printed circuit films 20a and 20b that are adjacent to each other, following a preliminary portion of the flexible film 100 corresponding to the flexible printed circuit film 20 that is actively being cut. The preliminary third hole h3a formed in this way becomes a third hole h3 into which the third support pins 303 are inserted and are then fixed when the cutting portion 304 descends to the flexible film 100 in cutting of the preliminary portion of the flexible film 100 corresponding to the flexible printed circuit film 20b.

Preliminary portions of the flexible film 100 may also be referring to as uncut portions of the flexible film 100. A group of the third holes h3 of the flexible film 100 are arranged along a leading edge of an uncut portion of the flexible film 100 which corresponds to the flexible printed circuit film 20 and is actively being cut. A first uncut portion corresponding to the flexible printed circuit film 20, a second uncut portion corresponding to the flexible printed circuit film 20a and a third uncut portion corresponding to the flexible printed circuit film 20b are in order in a direction opposite to the movement direction MD. In an embodiment, a group of the preliminary third holes h3a of the flexible film 100 is formed and arranged along a leading edge of the third uncut portion of the flexible film 100 (e.g., at flexible printed circuit film 20b in FIGS. 13 and 14), at a same time the first uncut portion is being cut from a remainder of the flexible film 100 using a group of the third holes h3 (e.g., at flexible printed circuit film 20 in FIGS. 13 and 14).

Figure 15:
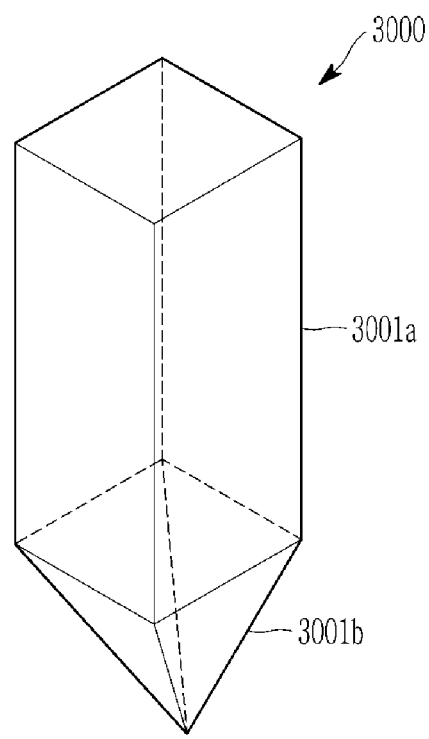
FIG. 15 to FIG. 17 show perspective views of embodiment of a portion of a device for providing a display device.
Figure 16:
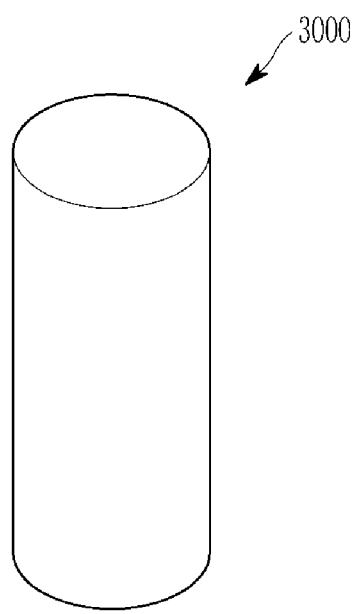
Figure 17:
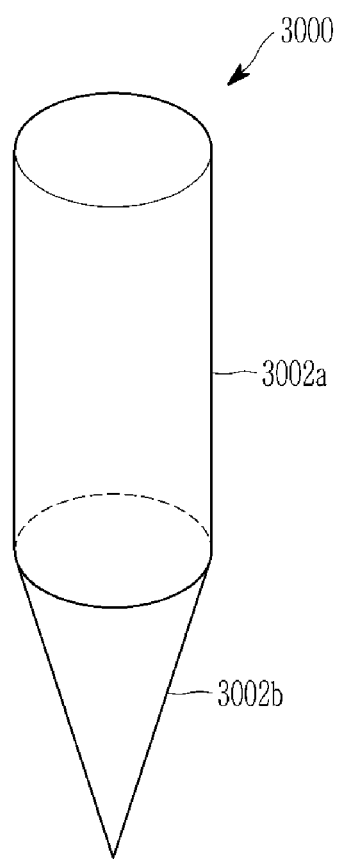

An embodiment of a portion of a device 2000 for providing a display device 1000 will be described with reference to FIG. 15 to FIG. 17 together with FIG. 5 and FIG. 6. FIG. 15 to FIG. 17 show perspective views of a portion of a device 2000 for a display device 1000.

A planar shape of a respective hole in the flexible film 100 may correspond to a planar shape of a respective support pin of the jig 300.

Referring to FIG. 15, a plurality of support pins 3000 includes the first support pins 301, the second support pins 302, and the third support pins 303 of the device 2000 for a display device 1000. Each of the plurality of support pins 3000 may include a body portion 3001a in a square column shape and an end portion 3001b which extends from the body portion 3001a and has a square horn shape such as a four-sided pyramid shape. The end portion 3001b may define the distal end of the support pin 3000. The end portion 3001b of the support pins 3000, in a square horn shape, is a leading end which is first inserted into the first holes h1, the second holes h2, and the third holes h3. A cross-sectional area of the end portion 3001b of the support pin 3000 is reduced in a direction from the body portion 3001a to the distal end so that the support pins 3000 may be easily insertable into the first holes h1, the second holes h2, and the third holes h3.

Referring to FIG. 16, the plurality of support pins 3000 including the first support pins 301, the second support pins 302, and the third support pins 303 of the device 2000 for providing a display device 1000 may have circular cylinder shapes.

Referring to FIG. 17, a plurality of support pins 3000 including the first support pins 301, the second support pins 302, and the third support pins 303 of the device 2000 for a display device 1000 may include a body portion 3002a in a circular cylinder shape and an end portion 3002b which extends from the body portion 3002a and has a circular horn shape. The end portion 3002b may define the distal end of the support pin 3000.

The end portion 3002b of the plurality of support pins 3000, in a circular horn shape, is a leading end which is first inserted into the first holes h1, the second holes h2, and the third holes h3, and a cross-sectional area of the end portion 3002b is reduced in a direction from the body portion 3002a to the distal end so that the support pins 3000 may be easily inserted into the first holes h1, the second holes h2, and the third holes h3.

Figure 18:
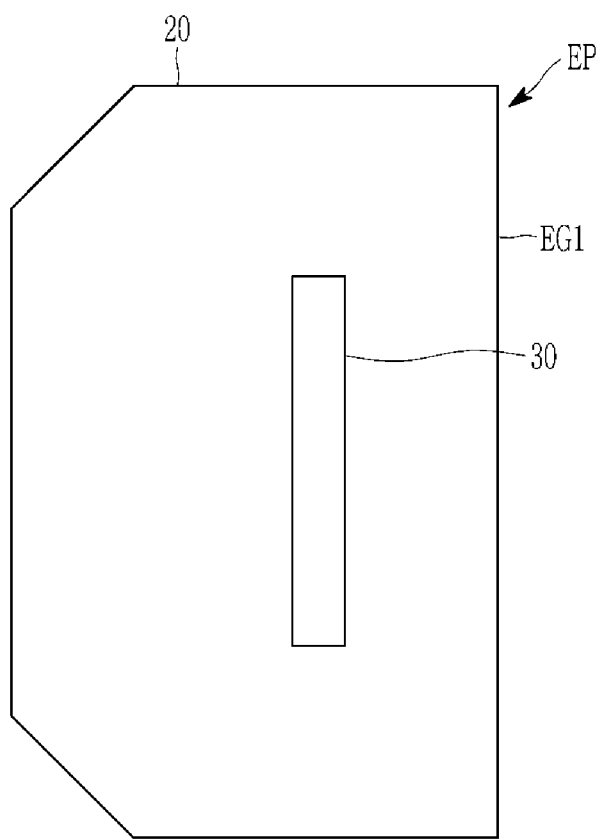
FIG. 18 and FIG. 19 show embodiment of a flexible printed circuit film.
Figure 19:
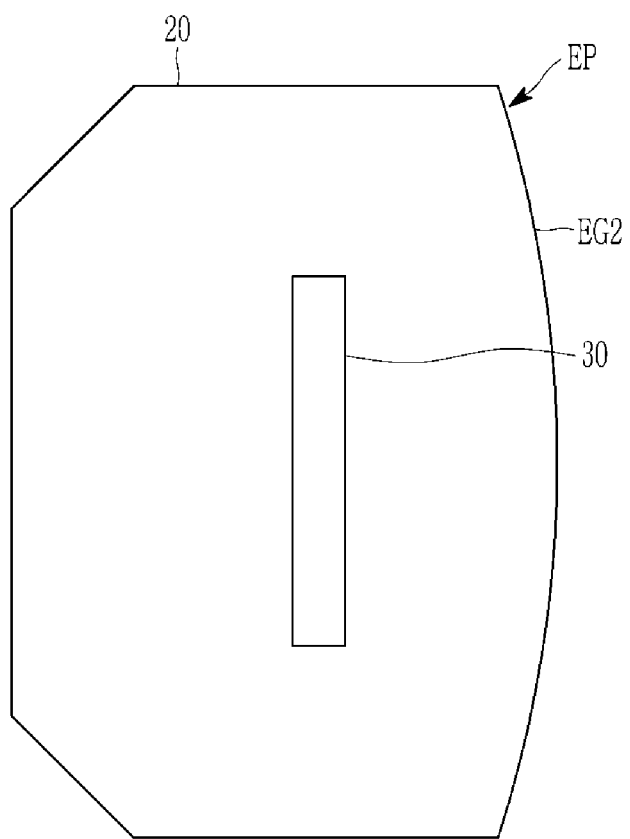

A flexible printed circuit film 20 made by a device 2000 for providing a display device 1000 will now be described with reference to FIG. 18 and FIG. 19. FIG. 18 and FIG. 19 show a concept of a flexible printed circuit film 20.

According to the manufacturing method using the device 2000 for providing a display device 1000, the first support pins 301 are inserted into the first holes h1 of the flexible film 100, the second support pins 302 are inserted into the second holes h2 of the flexible film 100, and the third support pins 303 are inserted into the third holes h3 of the flexible film 100, to apply various forces to the flexible film 100. In an embodiment, while the first force F1 and the second force F2 are applied in the direction outwardly from the respective edges of the flexible film 100, the third force F3 is applied in the outward direction that is orthogonal to the respective edges of the flexible film 100, a portion of the flexible film 100 corresponding to the flexible printed circuit film 20 and the IC chip 30 attached thereto is cut and separated from a remainder of the flexible film 100. As shown in FIG. 18, taken with FIGS. 2 and 3, the first end portion EP of the flexible printed circuit film 20 disposed closest to the encapsulation layer EN may be a straight edge having a substantially straight line. The first end portion EP of the flexible printed circuit film 20 may correspond to the leading edge discussed above related to FIGS. 13 and 14.

In a conventional device for providing a display device 1000, a plurality of first support pins 301 are disposed in sequence along the first edge E1 of the jig 300 and a plurality of second support pins 302 are disposed in sequence along the second edge E2 facing the first edge E1 and in parallel to the first edge E1, and a plurality of third support pins 303 are omitted along the third edge E3 that is orthogonal to the first edge E1 and the second edge E2. In using the conventional device, the flexible film 100 corresponding to the flexible printed circuit film 20 and the IC chip 30 attached thereto cut while the first force F1 and the second force F2 are applied in the direction facing toward the outside from the respective edges of the flexible film 100, and the third force F3 is not applied in the direction that is orthogonal to the respective edges of the flexible film 100. Therefore, as shown in FIG. 19, the center portion of the first end portion EP of the flexible printed circuit film 20 may be formed to have a protruding edge EG2 which protrudes further protruding than the edge EG1.

As described above, when the center portion of the first end portion EP of the flexible printed circuit film 20 is formed to have the protruding edge EG2 extended further protruding than the edge EG1, the encapsulation layer EN and the flexible printed circuit film 20 may have different gaps depending on positions along the edge. Particularly, the gap between the encapsulation layer EN and the flexible printed circuit film 20 is further reduced at the protruding center portion of the protruding edge EG2, and the flexible printed circuit film 20 may peel off or may be short-circuited at the same portion.

Figure 20:
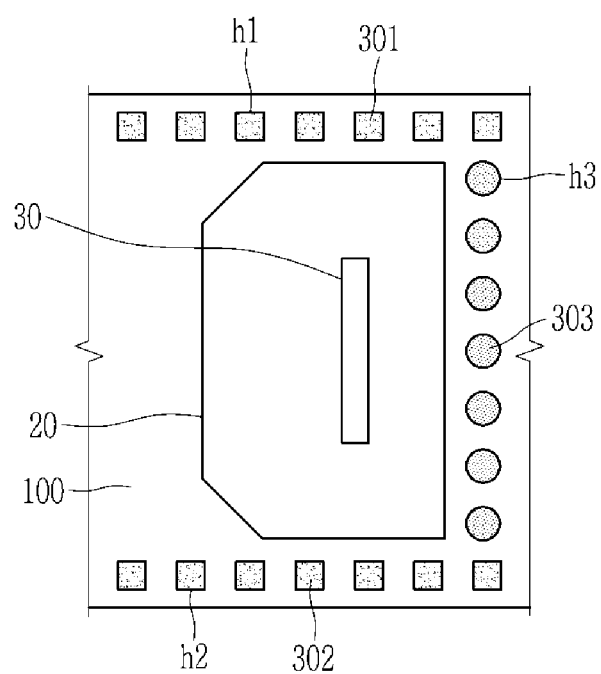
FIG. 20 shows an embodiment of a device for providing a display device.

An embodiment of a device 2000 for providing a display device 1000 will now be described with reference to FIG. 20. FIG. 20 shows a concept of a device 2000 for providing a display device 1000.

Referring to FIG. 20, differing from the device 2000 for providing a display device 1000 with reference to FIG. 5 and FIG. 6, planar shapes of the first support pins 301 and the second support pins 302 inserted into the first holes h1 and the second holes h2 of the flexible film 100 and fixed thereto may be different from planar shapes of the third support pins 303 inserted into the third holes h3 of the flexible film 100 and fixed thereto.

The planar shapes of the first support pins 301 and the second support pins 302 may be quadrangular, and the planar shapes of the third support pins 303 may be circular or oval.

Figure 21:
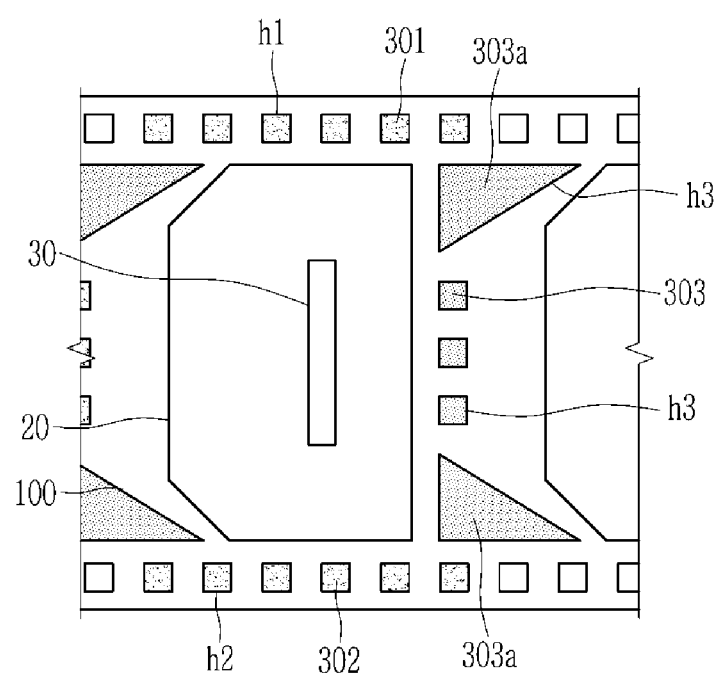
FIG. 21 shows an embodiment of a device for providing a display device.

A device 2000 for providing a display device 1000 will now be described with reference to FIG. 21. FIG. 21 shows a concept of a device 2000 for providing a display device 1000.

Referring to FIG. 21, differing from the device 2000 for providing a display device 1000 described with reference to FIG. 5 and FIG. 6, the planar shapes of the third support pins 303 that are inserted into the third holes h3 of the flexible film 100 and fixed thereto may be different from each other.

Two auxiliary third support pins 303a disposed closest to edges from among the third support pins 303 may have triangular shapes in a plan view, and a remainder of the third support pins 303 may have quadrangular shapes in a plan view. Cross-section areas of the two auxiliary third support pins 303a disposed at respective edges of the flexible film 100 from among the third support pins 303 may be greater than the cross-section areas of the third support pins 303. The third holes h3 corresponding to the two auxiliary third support pins 303a may have triangular shapes corresponding to the planar shapes of the auxiliary third support pins 303a.

An embodiment of a method using a device 2000 for providing a display device 1000 will now be described with reference to FIG. 22 to FIG. 25 together with FIG. 5 and FIG. 6. FIG. 22 to FIG. 25 show an embodiment of a method for providing a display device 1000.

Figure 22:
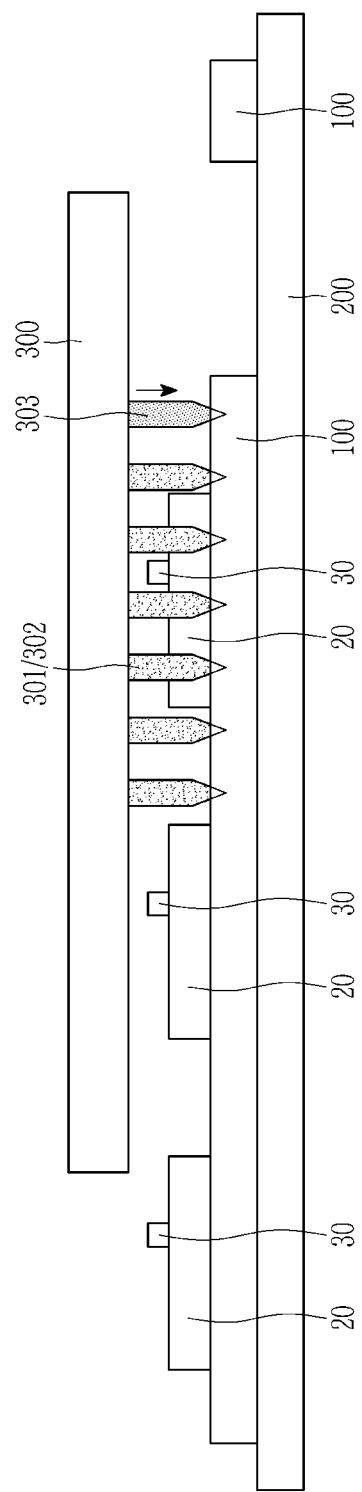
FIG. 22 and FIG. 23 show an embodiment of a method for providing a display device.
Figure 23:
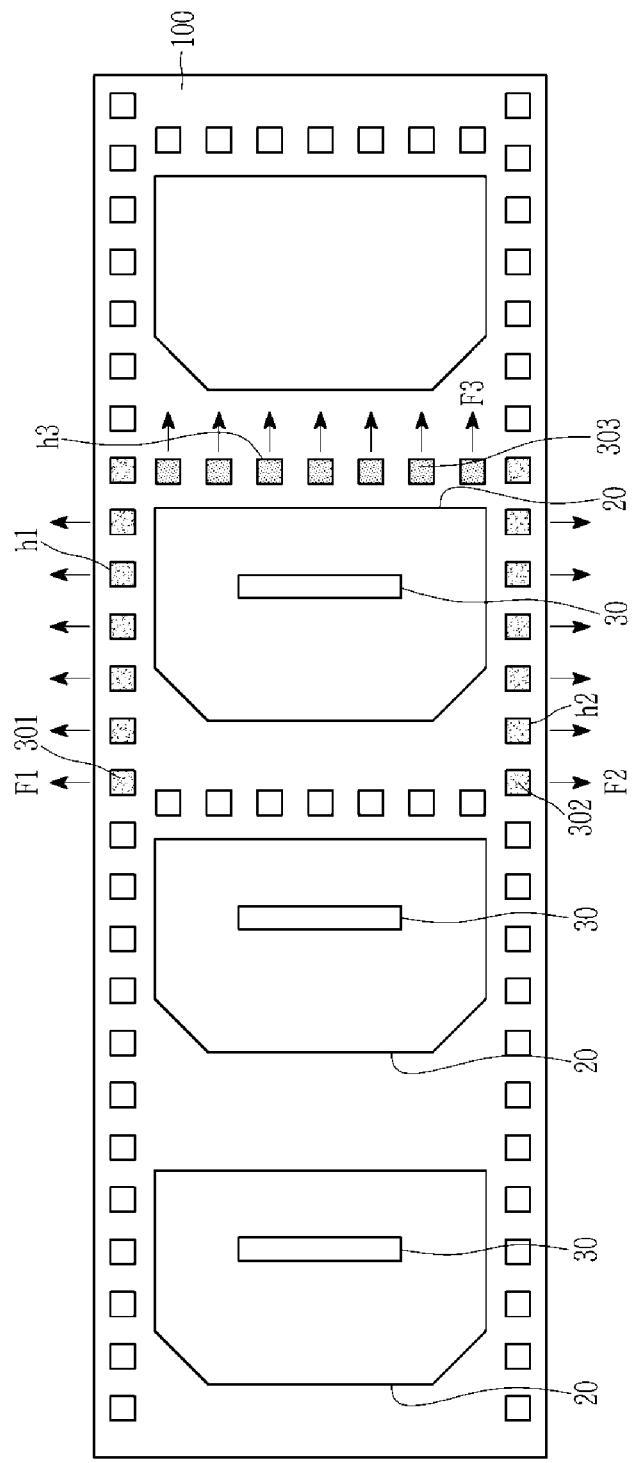

Referring to FIG. 22 and FIG. 23 together with FIG. 5 and FIG. 6, while the jig 300 of the device 2000 for providing a display device 1000 is disposed on the flexible film 100, the first support pins 301 disposed in sequence along the first edge E1 of the jig 300, the second support pins 302 disposed in sequence along the second edge E2 facing the first edge E1 and in parallel to the first edge E1, and the third support pins 303 disposed in sequence along the third edge E3 that is orthogonal to the first edge E1 and the second edge E2 descend toward the support 200. By this, the first support pins 301 are inserted into the first holes h1 of the flexible film 100, the second support pins 302 are inserted into the second holes h2 of the flexible film 100, and the third support pins 303 are inserted into the third holes h3 of the flexible film 100, and they are then fixed. The first support pins 301, the second support pins 302 and the third support pins 303 may descend together with each other and/or with the jig 300. In an embodiment, the third support pins 303 descent toward the support 200 together with descent of the first support pins 301 and the second support pins 302 toward the support 200.

Therefore, the first force F1 and the second force F2 are applied in the direction facing outward from the respective edges of the flexible film 100, and simultaneously, the third force F3 is applied in the direction that is orthogonal to the respective edges of the flexible film 100, and by this, the respective edges of the flexible film 100 are not bent but are maintained to be planar, and simultaneously, the flexible film 100 may be maintained to be flat while a center portion thereof to the edge are not bent.

Figure 24:
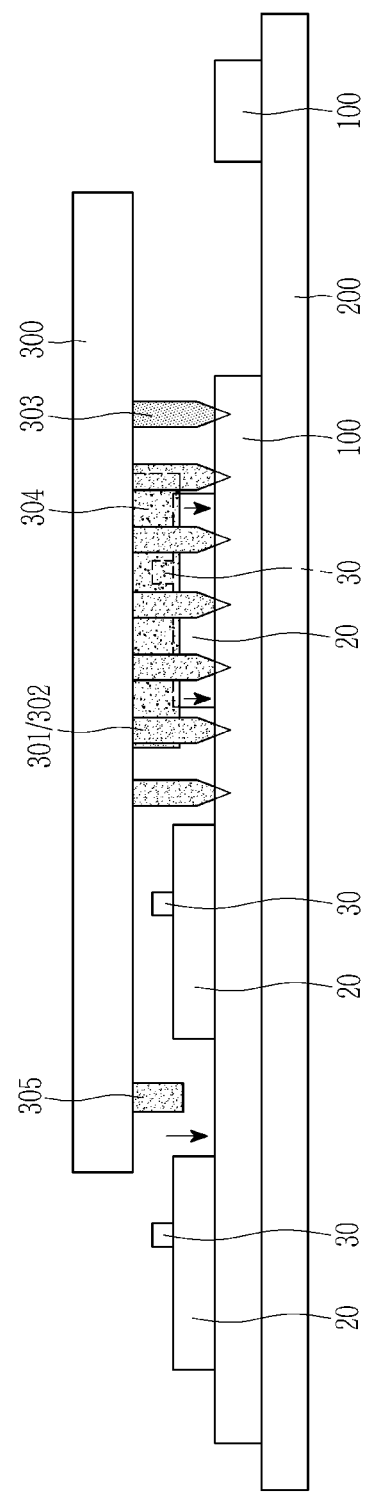
FIG. 24 and FIG. 25 show an embodiment of a method for providing a display device.
Figure 25:
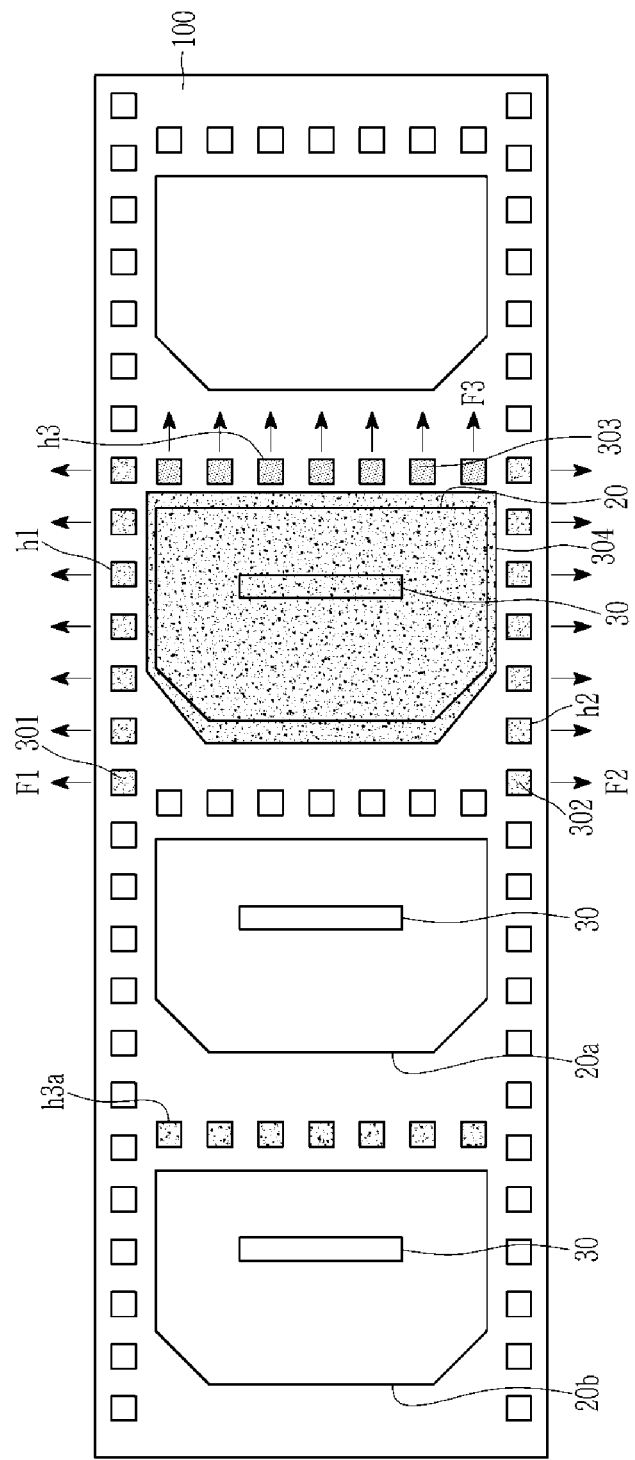

Referring to FIG. 24 and FIG. 25, while the first support pins 301, the second support pins 302, and the third support pins 303 are inserted into the first holes h1, the second holes h2, and the third holes h3 of the flexible film 100 and are fixed thereto, the cutting portion 304 descends, and a portion of the flexible film 100 which corresponds to the flexible printed circuit film 20 and the IC chip 30 attached thereto is cut and removed from a remaining portion of the flexible film 100. In an embodiment, the cutting portion 304 descends toward the support 200 after simultaneous descent of the first support pins 301, the second support pins 302, and the third support pins 303 toward the support 200.

In this instance, the hole cutting portion 305 descends together with cutting portion 304, and is disposed near the flexible film 100, so a preliminary third hole h3a may be formed in the flexible film 100 and disposed between two flexible printed circuit films 20a and 20b that are adjacent to each other and follow the flexible printed circuit film 20 along the movement direction MD of the flexible film 100. The preliminary third hole h3a formed in this way becomes a third hole h3 into which the third support pins 303 are inserted and are then fixed when the cutting portion 304 descends to the flexible printed circuit film 20b.

According to an embodiment of the method using the device 2000 for providing a display device 1000, the first support pins 301 are inserted into the first holes h1 of the flexible film 100, the second support pins 302 are inserted into the second holes h2 of the flexible film 100, and the third support pins 303 are inserted into the third holes h3 of the flexible film 100 so as to apply the first force F1 and the second force F2 in the direction facing to the outside from the respective edges of the flexible film 100, at the same time the third force F3 is applied in the direction that is orthogonal to the respective edges of the flexible film 100. As such, the portion of the flexible film 100 corresponding to the flexible printed circuit film 20 and the IC chip 30 attached thereto is cut, and the first end portion EP of a completed driving film which is closest to the encapsulation layer EN (see FIGS. 2 and 3) may be formed to have the edge EG1 which corresponds to a substantially straight line. Although not explicitly shown, a cut portion of the flexible film 100 may be included in the flexible printed circuit film 20 shown in FIGS. 2 and 3 and form a part thereof, without being limited thereto. That is, a cut edge of the cut portion of the flexible film 100 may define the first end portion EP which is closest to the encapsulation layer EN, without being limited thereto.

While this invention has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

What is claimed is:

1. A device for providing a display device, the device comprising:
   a support which supports a driver of a driving film of the display device and supports a flexible film having edges;
   a jig facing the support with the flexible film and the driver therebetween, the jig comprising:
      a first edge and a second edge facing and parallel to each other;
      a third edge orthogonal to the first edge and the second edge; and
      a plurality of support pins which fixes the edges of the flexible film, the plurality of support pins comprising:
         a plurality of first support pins arranged along the first edge;
         a plurality of second support pins arranged along the second edge; and
         a plurality of third support pins arranged along the third edge; and
   a cutting portion which is surrounded by the plurality of first support pins together with the plurality of second support pins and the plurality of third support pins of the jig.

2. The device of claim 1, wherein
   each of the plurality of first support pins, the plurality of second support pins, and the plurality of third support pins has a planar shape, and
   the planar shape of the plurality of first support pins and the planar shape of the plurality of second support pins corresponds to the planar shape of the plurality of third support pins.

3. The device of claim 2, wherein the planar shape of each of the plurality of first support pins, the plurality of second support pins, and the plurality of third support pins is a quadrangle.

4. The device of claim 1, wherein
   each of the plurality of first support pins, the plurality of second support pins, and the plurality of third support pins has a planar shape, and
   the planar shape of the plurality of first support pins and the planar shape of the plurality of second support pins are different from the planar shape of the plurality of the third support pins.

5. The device of claim 4, wherein
   the planar shape of the plurality of first support pins and the planar shape of the plurality of second support pins is a quadrangle, and
   the planar shape of the plurality of third support pins is a circle or an oval.

6. The device of claim 4, wherein the plurality of third support pins comprise:
   auxiliary third support pins respectively closest to the first edge and the second edge of the jig,
   remaining third support pins further from the first edge and the second edge of the jig than the auxiliary third support pins, and
   the planar shape of the auxiliary third support pins different from the planar shape of the remaining third support pins.

7. The device of claim 6, wherein
   the planar shape of the plurality of first support pins and the planar shape of the plurality of second support pins is a quadrangle,
   the planar shape of the auxiliary third support pins is a triangle, and
   the planar shape of the remaining third support pins is a quadrangle.

8. The device of claim 1, wherein
   the plurality of first support pins and the plurality of second support pins simultaneously descend toward the support, and the plurality of third support pins descend toward the support at a different time from descent of the plurality of first support pins and the plurality of second support pins toward the support.

9. The device of claim 8, wherein the plurality of third support pins descend toward the support after the descent of the plurality of first support pins and the plurality of second support pins toward the support.

10. The device of claim 9, wherein the cutting portion descends toward the support after descent of each of the plurality of first support pins, the plurality of second support pins, and the plurality of third support pins toward the support.

11. The device of claim 1, wherein the plurality of first support pins, the plurality of second support pins, and the plurality of third support pins descend together toward the support.

12. The device of claim 11, wherein
the plurality of first support pins, the plurality of second support pins, and the plurality of third support pins simultaneously descend toward the support, and
the cutting portion descends toward the support after descent of each of the plurality of first support pins, the plurality of second support pins, and the plurality of third support pins toward the support.

13. A device for providing an electronic device, the electronic device comprising:
a support which supports a driver of a driving film of the electronic device and supports a flexible film having edges;
a jig facing the support with the flexible film and the driver therebetween, the jig comprising:
a first edge and a second edge facing and parallel to each other;
a third edge orthogonal to the first edge and the second edge; and
a plurality of support pins which fixes the edges of the flexible film, the plurality of support pins comprising:
a plurality of first support pins arranged along the first edge;
a plurality of second support pins arranged along the second edge;
a plurality of third support pins arranged along the third edge;
a cutting portion which is surrounded by the plurality of first support pins together with the plurality of second support pins and the plurality of third support pins of the jig and separates a portion of the flexible film which corresponds to the driver from a remainder of the flexible film, to define the driving film of the electronic device.

* * * * *